United States Patent [19]

Frank

[11] Patent Number: 4,947,120

[45] Date of Patent: Aug. 7, 1990

[54] QUANTITATIVE NUCLEAR MAGNETIC RESONANCE IMAGING OF FLOW

[75] Inventor: Lawrence R. Frank, Newton, Mass.

[73] Assignee: Massachusetts Institute of Technology, Cambridge, Mass.

[21] Appl. No.: 152,760

[22] Filed: Feb. 5, 1988

[51] Int. Cl.$^5$ ............................................. G01R 33/20
[52] U.S. Cl. .................................................... 324/309
[58] Field of Search ............... 324/300, 306, 307, 309; 128/653

[56] References Cited

U.S. PATENT DOCUMENTS

| | | | |
|---|---|---|---|
| 4,486,708 | 12/1984 | Macovski | 324/309 |
| 4,565,968 | 1/1986 | Macovski | 324/309 |
| 4,609,872 | 9/1986 | O'Donnell | 324/306 |
| 4,639,671 | 1/1987 | Macovski | 324/306 |
| 4,716,367 | 12/1987 | Patz | 324/306 |

Primary Examiner—Michael J. Tokar
Attorney, Agent, or Firm—Hamilton, Brook, Smith & Reynolds

[57] ABSTRACT

A noninvasive method using nuclear magnetic resonance (NMR) to simultaneously obtain quantitative information and accurate imaging of structures and flow of a subject. The method is particularly suited to the study of anatomical detail and blood flow within the human body. Flow induces phase shifts are distinguished from systematic phases produced during image formation, thereby enabling the separation of flowing and stationary components.

39 Claims, 13 Drawing Sheets

QUANTITATIVE NUCLEAR MAGNETIC RESONANCE IMAGING OF FLOW

BACKGROUND

Nuclear magnetic resonance (NMR) imaging has become an established clinical method for the detection of tissue pathology in the human body. The conventional NMR image is generated by placing a sample in a spatially varying magnetic field and subjecting it to a radiofrequency (RF) electromagnetic signal. Nuclei within the sample absorbs energy from this signal depending upon the type of nucleus, the chemical environment of the nucleus, and the location of the nucleus in the non-uniform magnetic field. The nuclei absorbs and re-emits this energy during transitions between its two spin states.

The frequency of these nuclear transitions is given by the Larmor resonance equation: $V_o = B_o/2$ where $B_o$ is the magnetic field and is the gyromagnetic ratio, a constant for each type of nucleus. By recording the dissipated energy and correlating this with the location of the nucleus, an image of the sample can be produced.

Although these images primarily reveal anatomical differences, the unique sensitivity of NMR methods to motion has engendered the prospect of their use in the non-invasive assessment of blood flow. The fact that the motion of a fluid through magnetic field gradients has a distinct effect on the phase of the resulting signal was noted soon after the discovery of NMR. With the development of NMR imaging, this physical effect has been used as the basis for several techniques designed to provide information on flow in blood vessels. Current methods use either subtraction of images with different flow sensitivities to remove the static material, or selective excitation of moving material with special pulse sequences.

The method of subtraction of images utilizes additional gradient pulses to augment the signal generated by blood vessels without altering the signal from stationary tissues. By taking the difference between images with and without this augmentation, the stationary portion will cancel out tissue leaving, an image of the vessels alone. See Axel, Leon and Morton, Daniel, "MR Flow Imaging by Velocity-Compensated/Uncompensated Difference Images," Journal of Computer Assisted Tomography, 11(1), 31(1987). The use of imaging pulse sequences can involve the use of an imaging readout gradient in one direction which is unpulsed. See Wedeen, Van J. et al., "Projective MRI Angiography and Quantitative Flow-Volume Densitometry," Magnetic Resonance in Medicine 3, 226(1986). The use of such pulse sequences requires significant RF power to adequately cover the subject's bandwidth over the unpulsed gradient.

The synchronization of NMR imaging sequences to the heart cycle to reduce motion artifacts has been studied. See van Dijk, P. "Direct Cardiac NMR Imaging of Heart Wall and Blood Flow Velocity," Journal of Computer Assisted Tomography 8(3):429(1984). Van Dijk has disclosed a method of generating images of blood flow velocity which are color encoded. However, one velocity image is insufficient to quantify the velocity in more than one direction.

SUMMARY OF THE INVENTION

In a method of the present invention, quantitative information about flow velocity, flow volume, and the anatomical information normally present in conventional images are simultaneously generated in post-processing from a single, conventional NMR data set. The flow induced phase shifts are distinguished from systematic phases produced during image formation, enabling the separation of flowing and stationary components.

A body is placed within a magnetic field which can be linearly varied in any of three orthogonal directions. An RF electromagnetic pulse is generated within the body to stimulate nuclear magnetic resonance of nuclei within the body. By varying the magnetic field in one direction, there is a change in phase of the signal emitted by the material within the body depending upon the velocity at which the emitting material is being translated. Using a two-dimensional Fourier transform, a representation can be generated by iterating the application of the electromagnetic pulse and the first gradient while applying a series of gradients in a second direction. Three dimensional images can be generated by applying a gradient in a third direction that is orthogonal to the first and second gradients.

However, there are numerous phase shifts in the recorded signal caused by a variety of factors which operate to cloud the generated image. By removing phase shifts arising from specific sources and then separating the phase shifts due to static and flowing constituents of the body being examined, separate images of the static and flowing portions of the body can be realized. These separate images can then be color encoded and combined to provide a unified image of both structure and fluid flow.

First, a constant phase and a linear variation in phase with position is removed to correct for a phase ramp due to misalignments of the pulse sequence.

A complex image is then formed from only the lowest Fourier components of this new image, and this phase is then also subtracted from the representation. Because the vessels occupy only a small fraction of the image and are characterized by sharp spatial variations, most of the velocity information in the phase variations is preserved.

The static and moving components of the body being analyzed are separated by determining a threshold phase $\phi_{cutoff}$, and applying a phase dependent mask to the complex image. An image of the stationary tissue is produced by displaying the magnitude of only those pixels or small incremental portions of the body with $|\phi| < \phi_{cutoff}$ and an image of the flowing component is produced by displaying those pixels with $|\phi| > \phi_{cutoff}$.

The flow image can be further improved by removing pixels with magnitudes below a certain level. The magnitude cutoff is chosen to eliminate artifacts from the representation having small amplitude but large changes in phase.

This method for the generation of flow images has several desirable features. A conventional NMR image is used, no special pulse sequences are necessary, and imaging time is not increased. No additional images are required, and because only post processing is employed, previously acquired images may be analyzed. For example, the processing can be applied to pre-existing three-dimensional data.

Because the static and the flowing images are constructed from the same data set, registration problems associated with subtraction techniques do not arise. Flow appears in its proper anatomical context while information about static tissue normally present in NMR images is retained. The method is effective even at high flow rates and allows simultaneous imaging of both venous and arterial flow and discrimination between the two based on the direction of flow. Further, the ability to provide a quantitative measure of the volume flow through a vessel makes it potentially useful in the in-vivo assessment of occlusive and aneuresmatic processes.

BRIEF DESCRIPTION OF THE DRAWINGS

The file of this patent contains at least one drawing executed in color. Copies of this patent with color drawing(s) will be provided by the Patent and Trademark Office upon request and payment of the necessary fee.

DETAILED DESCRIPTION OF THE INVENTION

The phase change of the NMR signal produced by a small element of tissue at position r(t) when subjected to a time dependent gradient G(t) (gauss/cm) is $$\phi = \int_{t_1}^{t_2} G(t) \cdot r(t) dt \qquad (1)$$

where is the gyromagnetic ratio ($\gamma/2 = 42.573$ MHz/Tesla for protons). A series of gradient pulses for which $\int G(t)dt=0$ produces no net phase change for stationary tissue, but moving fluid will develop a phase change that depends on the motion. For a constant velocity during the data acquisition interval, the signal phase is proportional to the velocity. Thus, following Fourier transformation, regions of flow in the image possess a phase reflecting the spatially dependent velocity distribution. Although such phase changes are present in conventionally acquired images due to flow through the applied imaging gradients, these intrinsic phases are usually overwhelmed by extrinsic phase changes resulting from eddy currents from the pulsed gradients, spatial non-uniformity of the transmitting coil, magnetic susceptibility effects, or misalignments in the pulse sequence. For this reason, previous approaches using this effect for imaging flow in vessels have relied on special pulse sequences which minimize these systematic phase shifts, or subtraction of multiple images with different flow sensitivities but similar systematic phase shifts.

Figure 1:
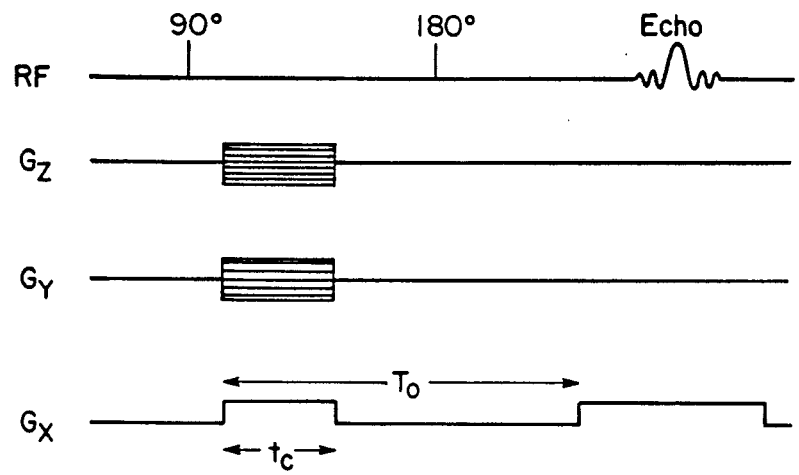
FIG. 1 is a schematic illustration of a spin-echo imaging sequence used in the present invention.

The pulse sequence shown in FIG. 1 is a standard spin-echo imaging sequence used in many NMR applications. At the center of the data acquisition, an echo is formed as a result of the effects of the x-gradient and the 180° refocusing pulse. The y-gradient is sequenced to its next value after each sweep of the x-gradient after a two-dimensional image is formed. The z-gradient can be sequenced through a series of values to generate a three-dimensional image.

After data collection and Fourier transformation, a complex image (FIG. 2A) is formed in which each pixel corresponding to a portion of the body being imaged has both a magnitude and phase. For fluid moving with x-velocity component $v_x$ the phase change in addition to that acquired by the static material is $$\Delta\phi(x,y) = v_x(x,y) G_x T_0 t_c + \phi_s(x,y) \qquad (2)$$

where $\phi_{flow} = V_x(x,y) G_x T_0 t_c$ and $\phi_s$ represents all systematic instrumental effects which alter the phase. Spatial variation in $\phi_s$ results from many sources and so possesses a complicated structure that varies with each experiment and subject and makes interpretation of the raw phase map difficult. For a two-dimensional image, the phase of $\phi s$ can be broken into its principal components $$\phi_s = \phi_0 + \phi_1(x,y) + \phi_2(x,y) + \phi_3(x,y)t + \phi_{FLOW}(x,y,t) \qquad (3)$$

where $\phi_0$ is a constant variation in the phase, $\phi_1(x,y)$ is a linear change in phase, $\phi_2(x,y)$ represents a slow variation in phase over the image, $\phi_3$ represents turbulent motion and noise, and $\phi_{FLOW}(x,y,t)$ represents the flow of fluid.

Figure 3:
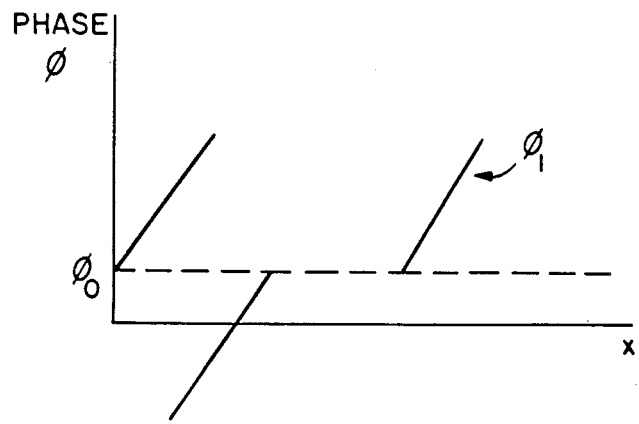
FIG. 3 is a graphical illustration of a constant phase $\phi_0$ and a linear change in phase $\phi$ are removed from NMR image.
Figure 2:
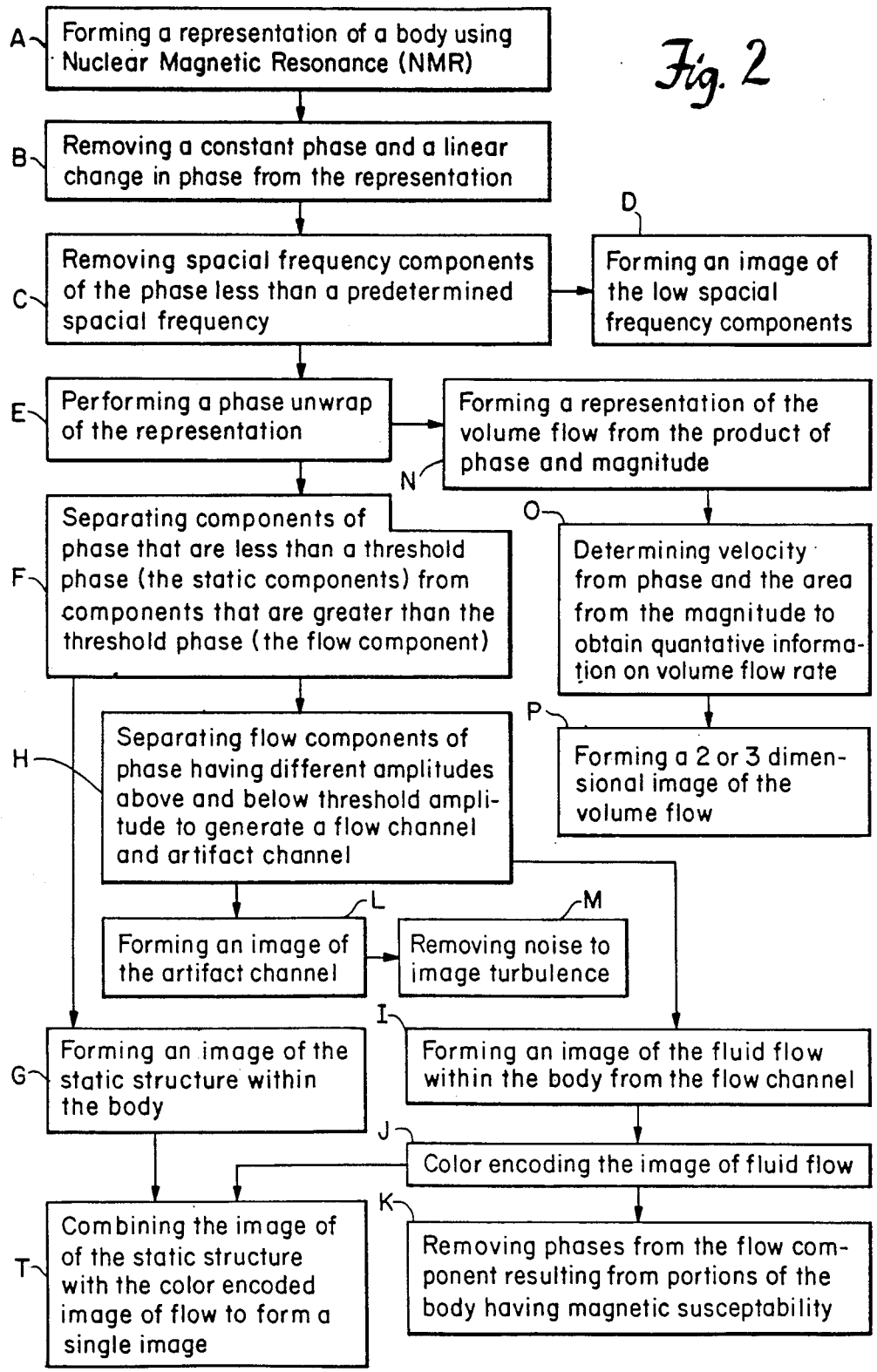
FIG. 2 is a process flow diagram illustrating the processing steps of the present invention.

From the raw phase map a constant $\phi_0$ plus a linear variation with position $\phi_1$ is removed at B in FIG. 2 to correct for a phase ramp due to misalignments of the pulse sequence. FIG. 3 illustrates a typical constant phase $\phi_0$ and linear change in phase $\phi_1$ which are removed from the image. Bayes probability theory can be used to provide an estimate of this phase correction. For example, consider the sum $$C = \sum_x \sum_y |A(x,y)e^{i(\phi_0 + (\phi_x)(x) + (\phi_y)(y)} - A^1(x,y)e^{i'}|^2$$

where $A(x,y)$ is the amplitude, $\phi_o$ is the constant phase, $\phi_x + \phi_y$ is the linear change in phase and $\phi'$ is the actual phase. This expression can be minimized to estimate the three phase parameters $\phi_0$, $\phi_x$, and $\phi_y$.

Figure 4:
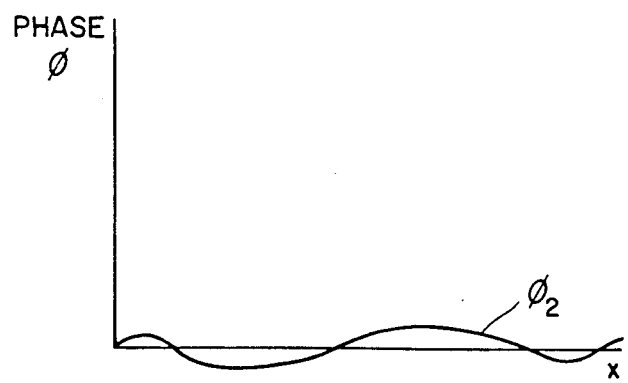
FIG. 4 is a graphical illustration of a phase having a low spatial frequency.

The extrinsic phase $\phi_2$ can be removed as shown at C in FIG. 2 by using the fact that $\phi_2(x,y)$ varies slowly with position, while the intrinsic flow induced phase shifts are confined to vessels. This slow variation in phase $\phi_2$ is graphically illustrated in FIG. 4.

An inverse Fast Fourier transform then converts the frequency dependent signal into a time dependent signal. A low pass filter is used to separate out the $\phi_2(x,y)$. Using a Fast Fourier transform, a complex image is then formed at D in FIG. 2 from only the lowest Fourier components of this new image, and this phase is then also subtracted out. This complex image of $\phi_2$ is visually inspected to evaluate whether the filter is also removing useful phase information for a particular subject and therefore needs adjustment. Because the vessels of the typical subject occupy only a small fraction of the image and are characterized by sharp spatial variations, most of the velocity information in the phase variations is preserved.

Alternatively, it is possible to design the low pass filter that removes the residual phase $\phi_2$ by assessing the necessary phase resolution for a particular subject. The signal in the form $$S(k_x,k_y) = \int \int M(x,y) e^{ik_x x} e^{ik_y y} e^{i\phi_{flow}(x,y)} e^{i\phi_{slow}(x,y)} dx dy$$

Where $M(x,y)$ is the particle density and the resolution in x and y respectively is:

$$\Delta x = \frac{1}{G_x t_c}, \Delta y = \frac{1}{N_y \Delta G_y T_y}$$

($t_c = t_x/2$ = one-half of the date collection period, $N_y$ = the number of $K_y$ encoding steps, G = Gradients.)

Now, the resolution is chosen by the experimentor according to the desired experiment. We need only concern ourselves with defining a new resolution $\sigma$ for the phases. This is done as follows. Rewrite the resolution in units of the number of samples (since in practice it is desirable to number the samples):

$$\Delta x = \frac{1}{G_x N_{x/2}}$$

Thus, the desired fraction of the number of samples originally taken in the image, by a fraction dependent on the ratio of the desired phase resolution to the image resolution. Therefore, the phase resolution can be written:

$$\Delta \phi = \frac{1}{G_x N_{x/2}'}$$

where $N_x'$ is the number of samples prior to transform:

$$\frac{\Delta \phi}{\Delta x} = \frac{N_x'}{N_x} \text{ or } N_x' = \frac{\Delta \phi}{\Delta x} N_x$$

There are at least two ways of making this choice. One is to ensure that the new phase resolution is much greater than any anatomical structure; an estimate is then made with the knowledge of the dimensions of the anatomical structure in question. The second method is to select the fraction of the field of view $$L_x = \frac{N_x}{G_x t_c}$$

over which the phase can vary appreciably $$L_x' = \frac{N_x'}{G_x t_c}.$$

This is essentially equivalent to the first choice, however, as the relationship between the anatomical dimensions and the field of view are known.

It is also useful to check visually that the phase formed from the low pass wrap is indeed slowly varying. For many applications, these considerations lead to a choice of $$\frac{\Delta \phi}{\Delta x} = \frac{1}{16}$$

or for
$N_x = 256$, $N_x' = 16$.

Figure 5:
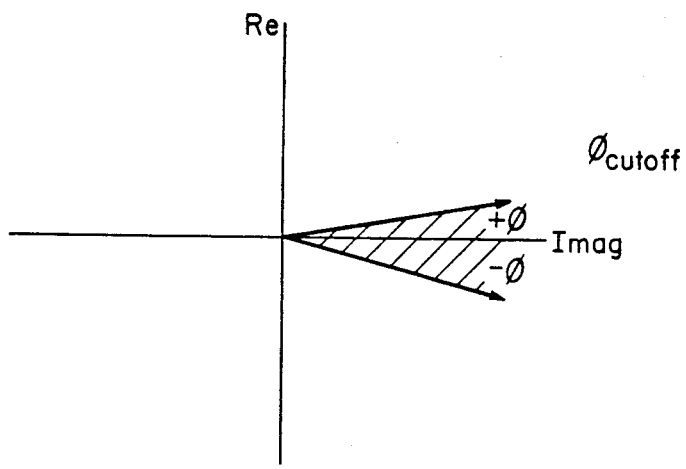
FIG. 5 is a graphical phasor diagram illustrating a filter used to remove phases having an amplitude less than $\phi_{cutoff}$.

Having removed the residual phase $\phi_2$, the phase is unwrapped at E in FIG. 2. The static and moving components are then separated at F in FIG. 2 by choosing a threshold phase $\phi_{cutoff}$ and applying a phase-dependent mask to the complex image. Such a mask is schematically illustrated in the phasor diagram of FIG. 5. An image of the stationary tissue is produced at G in FIG. 2 by displaying the magnitude of only those pixels with phase $|\phi| < \phi_{cutoff}$ and an image of the flowing component is produced by displaying those pixels with $|\phi| > \phi_{cutoff}$.

Figure 6:
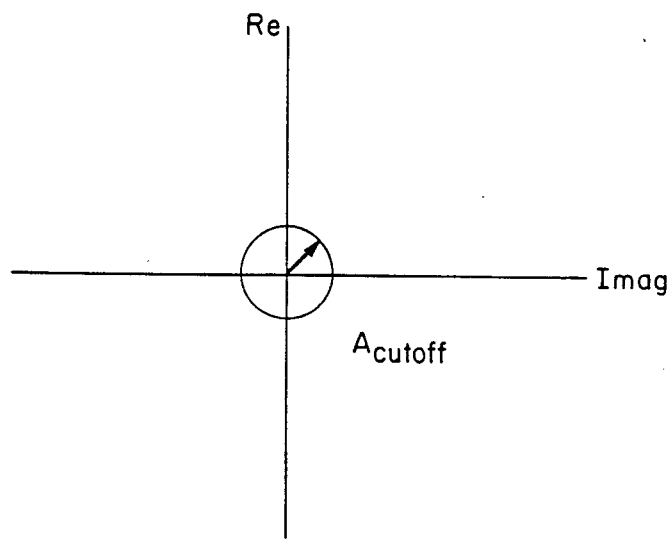
FIG. 6 is a graphical phasor diagram illustrating a filter used to remove portions of the image having an amplitude less than $A_{cutoff}$.

Note that by applying a magnitude threshold to the flow image at H in FIG. 2 there is a reduction in some of the motion artifacts represented in equation 3 by $\phi_3(x,y,t)$, which often have large phase changes but low amplitudes. These artifacts may include turbulence or non-laminar flow within a particular flow volume. Thus the flow channel is formed from pixels with phase shift above the cutoff, and with magnitude above a cutoff. A third or artifact channel is produced in FIG. 2L from pixels with a phase shift above the cutoff, but magnitude below the cutoff. This amplitude cutoff is schematially illustrated in the phasor diagram of FIG. 6.

The flow, static, and artifact channels each contain complex data and hence full phase information. Magnitudes of each channel have been displayed in order to show the quantitative information about the local steady-state magnetization, which is proportional to the magnitude of the image.

Figure 7:
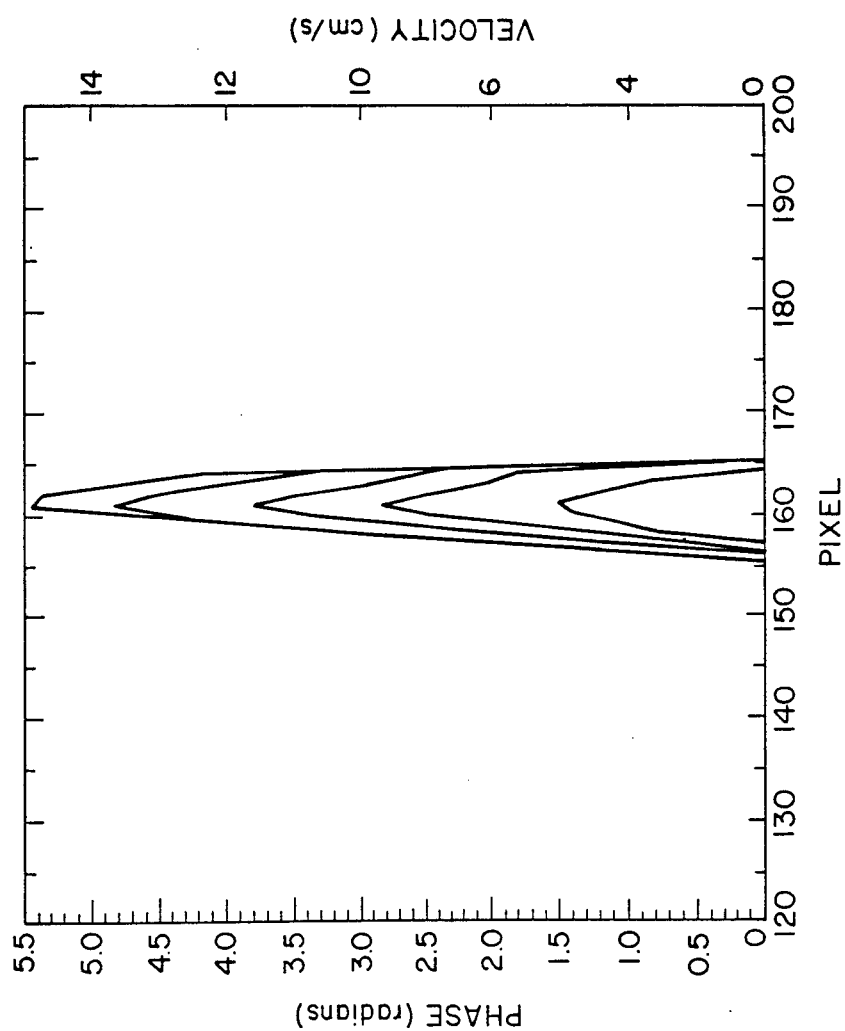
FIG. 7 is a graphical illustration of a series of phase profiles of a single image line from a series of images of water flowing within a tube in which only flow rate was varied.
Figure 8:
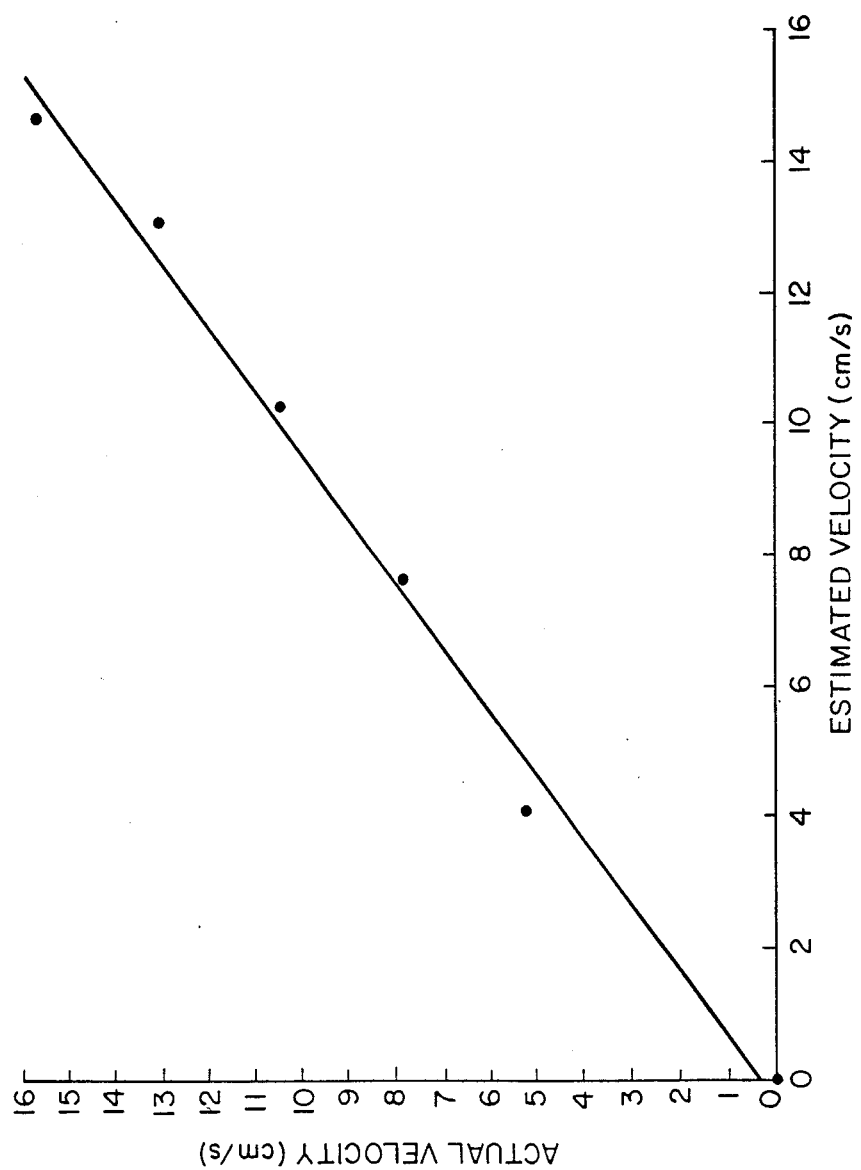
FIG. 8 is a plot of estimated flow velocities versus actual flow velocities.

Estimates of quantitative accuracy were obtained by acquiring a series of phantom images at different flow rates. These phantom images were constructed by pumping water at a constant rate through tubing inserted in a water filled bottle. Sensitivity to flow velocity was examined by constructing the phase profiles of the flow channels perpendicular to the direction of flow, as shown in FIG. 7 where phases with absolute value greater than $\pi$ have been unwrapped. These accurately reflect the parabolic velocity profile of laminar flow. A plot of the predicted velocities versus the actual velocities is shown in FIG. 8. This indicates that the present method can accurately discern flow velocities.

Figure 9:
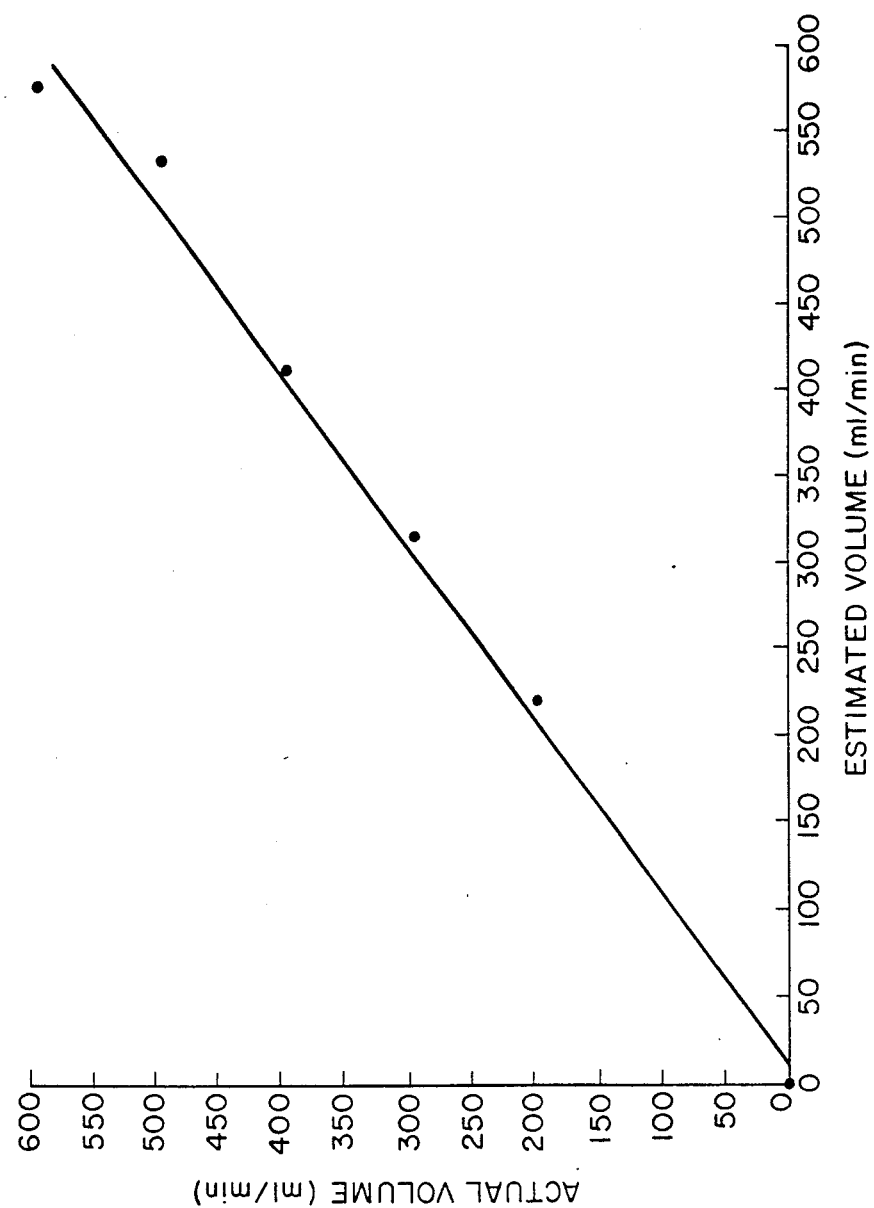
FIG. 9 is a plot of estimated flow volume versus actual flow volume.

A map of the volume flow rates is formed by the product of the magnitude channel and the phase of the flow channel. Flow volumes were estimated on the assumption that the slice precisely bisected the tube, that flow was uniformly laminar, and that the tube cross-section was circular. Note that in three dimensional acquisitions, this assumption is unnecessary as the geometry of the vessel containing flow will be automatically acquired. The phase component was converted to velocity through the first term in equation 2; magnitude was normalized with reference to a static portion of the image in order to estimate the signal intensity per unit volume of material. Some averaging of the volume over short lengths of the flow channel can be incorporated to smooth out noise effects. The results shown in FIG. 9 suggest that accurate flow volume estimates may be obtained by this method. In addition, such volume measurements should exhibit independence of flow angle as a result of the fact that the product of the x-component of velocity and the vessel area normal to x is independent of orientation. A potential source of error in such estimates is signal cancellation within a voxel due to shear flow, but this can be minimized by adjusting the pulse sequence parameters in equation 2 for different applications.

Figure 10:
FIG. 10 is a photograph of the magnitude image of a coronal section through the chest of a normal human subject viewed anteriorly.
Figure 11:
FIG. 11 is a photograph of the magnitude of the flow channel for the subject of FIG. 6.
Figure 12:
FIG. 12 is a photograph of the magnitude of the static channel for the subject of FIG. 6.
Figure 13:
FIG. 13 is a photograph of the magnitude of the artifact channel for the subject of FIG. 6.

The results of applying the method to an image of a normal human subject are shown in FIGS. 10-14. The image shown is a coronal section through the chest anteriorly, acquired using a standard, gated spin-echo sequence. This anatomical region contains a diversity of flow related phenomena from the heart and its vasculature and from the vessels of the neck. In particular, this region contains both arterial (pulsatile) and venous (steady) flow, flowing both peripherally and centrally, and with a wide range of velocities. The original image is shown in FIG. 10, and the magnitudes of the flow, static, and artifact channels in FIGS. 11-13. The flow channel magnitude (FIG. 11) shows clear separation of the major vascular structures, even in regions containing complex flow patterns. For instance, clearly shown is the confluence of the right internal jugular vein (RIJV) and the right subclavian vein (RSCV) to form the right braciocephalic vein (RBCV) before descending out of the image plane at the junction of the superior vena cava. Identification of flow within the chambers of the heart is more difficult because the flow is turbulent and hear wall motion can be significant. Motion of the left ventricular (LV) wall has caused it to appear in the flow channel.

Velocity information is encoded in the phases of the flow channel. Flow velocities are located within the anatomical image by superimposing the phase of the flow channel, color coded to represent the range of phases from $\pi \leq \phi_m \leq \pi$, with the magnitude of the static channel displayed on a standard grey scale.

Figure 14:
FIG. 14 is a photograph of a combined image of both the static and flow channels.

FIG. 14 is an anatomical flow velocity map in which the velocity information in the phase of the flow channel is combined with the anatomical information in the static channel. A useful property of this representation is that it presents not only the flow regions, but the direction of flow, thus facilitating identification. In this particular image, peripheral flow tends toward red while central flow tends toward blue. Further, since only the phases are used in the flow channel, any variations in signal amplitude which may occur because of shear flow, do not affect the displayed image.

Figure 15:
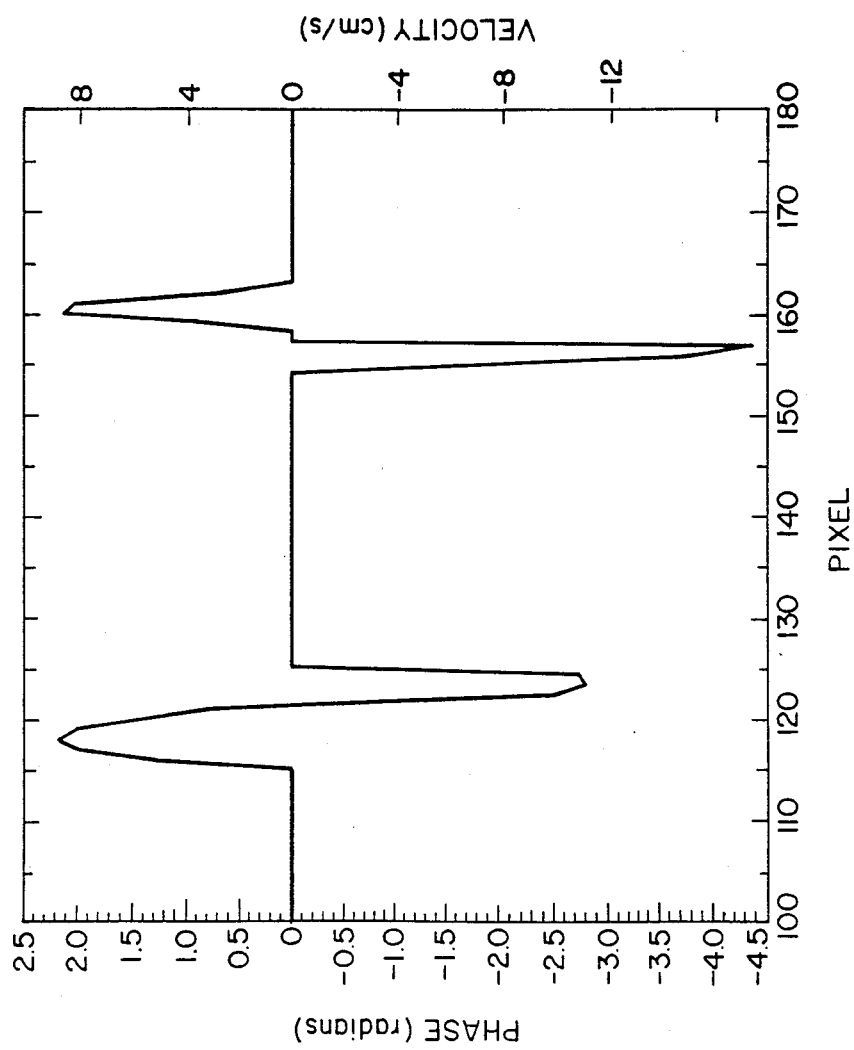
FIG. 15 is a graphical illustration of the unwrapped phase of a single line of the flow channel taken across the neck to reveal the parabolic flow profiles and direction of flow for the carotid arteries (negative phase) and the jugular veins (positive phase).

The phase and velocity of one line of the flow channel, taken across the neck, is shown in FIG. 15. The magnitude and direction of the flow from the carotid arteries and from the jugular veins is clearly identified. The anatomical velocity map might prove particularly useful in studying regions of turbulence, such as the heart. For although the precise flow detail present in the vessels is not available in such regions, general trends may be observed. For example, the region of the anatomical velocity map containing the heart chambers suggests a large region of flow down into the right atrium (RA) curving up into the right ventrical (RV), consistent with normal flow patterns.

Where objects to be imaged using NMR become magnetized susceptability artifacts can be exhibited. The magnetization can lead to field inhomogeneities which interfere with the gradients and thereby cause distortion of images in the vicinity of the magnetized material.

In regions of high susceptability changes in phase can be analyzed in manner analogous to the flow channel. By examining the susceptability of a human subject in its proper anatomical context, portions of the image arising from susceptability can be identified and used in clinical evaluation.

Phase effects resulting from the use of surface coils to obtain images of localized areas with higher signal to noise ratios can also be analyzed according to the processing scheme to generate clearer imaging.

There are many equivalents to the embodiments specifically described herein and such equivalents are intended to be covered by the following claims. For example, there are numerous pulse sequences that may be used to generate nuclear magnetic resonance within a body being studied. All of these sequences will produce signals containing magnitude and phase information which can be processed in accordance with the present invention to reveal quantitative information about structure and fluid flow within the body.

I claim:

1. A method of generating an image of structure and fluid flow within a body using magnetic resonance comprising:
   forming a representation of a body having static structure and fluid flow using magnetic resonance;
   applying a phase dependent filter to the representation to generate a first representation of the static structure and a second separate representation of the fluid flow;
   generating separate images of static structure and fluid flow within the body from the first and second representations;
   color encoding at least the image of fluid flow; and
   combining the separated images to form a single image of both the static structure and fluid flow.

2. The method of claim 1 wherein said color encoding step comprises encoding fluids having different velocities with different colors.

3. A method of generating an image of structure and flow within a body using magnetic resonance comprising:
   forming an image of a body having static structure and fluid flow using magnetic resonance;
   applying a phase dependant filter to the image; and
   generating separate images of the static structure and the fluid flow from the filtered image.

4. The method of claim 3 wherein said generating step comprises:
   separating portions of the formed image having a phase greater than a predetermined threshold to generate the image of fluid flow; and
   separating portions of the formed image having a phase less than threshold to generate the image of the static structure.

5. The method of claim 3 further comprising the step of separating an artifact image from the image of fluid flow wherein portions of the fluid flow image having an amplitude less than a threshold amplitude are used to form the artifact image.

6. A method of imaging a body using magnetic resonance comprising:
forming a representation of a body using magnetic resonance;
removing portions of the representation having a slowly varying spatial variation in phase.

7. The method of claim 6 further comprising the step of forming an image of fluid flow within the body.

8. The method of claim 6 further comprising the step of forming an image of static structure within the body.

9. A method of generating an image of fluid flow within a body using magnetic resonance comprising:
forming an image of a body using magnetic resonance; and
removing constant and linear changes in phase from the image.

10. A method of measuring a fluid flow within a body comprising the steps of:
forming a magnetic field within a body having a fluid flow;
producing an electromagnetic pulse within the body;
varying the magnetic field in a first direction;
recording an electromagnetic signal emitted by portions of the body in response to said pulse;
transforming the signal to form a representation such that the representation has a plurality of phase components with different spatial frequencies;
removing a constant phase and a linear changes in phase from the representation;
removing spatial frequency components of phase from the recorded representation less than a predetermined spatial frequency;
separating changes in phase from the representation generated by static structure within the body; and
separating components of the recorded signal whose amplitude are above and below a predetermined level such that the components with an amplitude above said level are generated by fluid flowing within the body.

11. The method of claim 10 wherein said recording step is followed by the steps of:
producing a second pulse within the body;
varying the magnetic field in a second direction orthogonal to the first direction;
varying the magnetic field in said first direction;
recording a second electromagnetic signal emitted by the body in response to said second pulse; and
iterating the above steps to obtain a two dimensional set of recorded signals.

12. The method of claim 11 wherein said iterating step is followed by the steps of:
varying the magnetic field in a third direction orthogonal to the first and second directions; and
repeating the previous steps to obtain a three-dimensional set of recorded signals.

13. The method of claim 10 wherein said step of separating changes in phase generated by static structure within the body comprises the steps of:
determining a magnitude of the change in phase at each emitting portion of the body;
comparing this magnitude with a predetermined phase level; and
separating the representation into those portions with phase magnitude less than the predetermined phase level.

14. The method of claim 13 further comprising the step of forming an image of the static structure of the body from the separated phase changes generated by the static structure.

15. The method of claim 10 further comprising the step of determining the velocity of the fluid flowing at a plurality of locations within said body from the separated components having amplitudes above the predetermined level.

16. The method of claim 15 further comprising the step of forming an image of the fluid flowing within the body from the determined velocities.

17. The method of claim 16 wherein said image is comprised of a plurality of colors, each color correlated with a portion of the fluid whose velocity is within a predetermined range.

18. The method of claim 10 wherein said removing step further comprises approximating the constant phase and the linear change in phase.

19. The method of claim 10 wherein said predetermined frequency is selected to remove slowly varying spatial changes in phase from the representation.

20. The method of claim 10 wherein said spatial frequency removing step comprises the steps of:
transforming the representation from a frequency dependent function into a time dependent function;
filtering the time dependent function with a low pass filter;
transforming the filtered time dependent function into a frequency dependent function; and
removing the frequency dependent function from the representation.

21. The method of claim 20 further comprising the step of forming an image of the frequency dependent function.

22. The method of claim 10 further comprising the steps of determining the magnitude of the representation forming an image with the determined magnitudes.

23. The method of claim 22, further comprising the step of determining the volume flow rate from the product of the determined magnitude at each portion and the phase of the fluid flowing through each respective portion.

24. The method of claim 23 wherein said determining step comprises calculating the velocity and areas of each portion from the phase and the magnitude of the portion.

25. The method of claim 24 further comprising the step of forming an image from the determined volume flow rate.

26. A method of using nuclear magnetic resonance to image structure and fluid flow within a body comprising the steps of:
producing nuclear magnetic resonance within a body;
recording a signal generated by the magnetic resonance within the body;
forming a representation of the signal;
removing constant and linear changes in phase from the recorded representation; and
removing slowly varying changes in phase from the representation.

27. The method of claim 26 further comprising the step of separating a phase from the representation generated by static structure within the body.

28. The method of claim 26 further comprising the step of separating phases form the representation whose amplitude is above a predetermined level such that said phases are generated by fluid flowing within the body.

29. The method of claim 28 further comprising the step of forming an image from the representation whose amplitude is below the predetermined level.

30. The method of claim 26 further comprising the steps of:

separating phases within the formed representation generated by portions of the body having a high magnetic susceptibility.

31. A system for structure and fluid flow within a body using magnetic resonance comprising:

a data processor for transforming a signal produced by magnetic resonance of the body into a representation of the body, the data processor having a phase dependent filter to separate the representation into a first component and a second component, the first component resulting from static structure within the body, and the second component resulting from fluid flow within the body.

32. The system of claim 31 wherein said filter separates the representation into the first component having an absolute value of phase less than a selected phase and into the second component having an absolute value of phase greater than the selected phase.

33. The system of claim 32 wherein said data processor further comprises an encoder for encoding the separated structure and the separated flow.

34. The system of claim 33 wherein said data processor further comprises combining means for combining the encoded separated structure with the encoded separated flow.

35. The system of claim 34 further comprising imaging means for generating an image of the combined structure and flow.

36. The system of claim 31 further comprising a recording system to record a signal generated by a body during magnetic resonance of the body.

37. A system for processing data acquired by magnetic resonance comprising a data processor to form a representation of an object having static structure and fluid flow, the data processor having a filter to separate components of phase of the representation into a first component and a second component, the first component having an absolute value of phase less than a selected phase that results from static structure within the body and the second component having an absolute value of phase greater than the selected phase which results from fluid flow within the body.

38. The processing system of claim 37 further comprising a second filter such that components of the representation having a slowly varying spatial variation in phase are removed from the representation.

39. The processing system of claim 37 further comprising a second filter such that components of the representation having constant and linear variations in phase are removed from the representation.

* * * * *